United States Patent
Chen et al.

(10) Patent No.: US 10,842,054 B2
(45) Date of Patent: Nov. 17, 2020

(54) EXTENDED HEAT SINK DESIGN IN SERVER

(71) Applicant: QUANTA COMPUTER INC., Taoyuan (TW)

(72) Inventors: Chao-Jung Chen, Taoyuan (TW);
Yi-Chieh Chen, Taoyuan (TW);
Yueh-Chang Wu, Taoyuan (TW);
Yi-Ta Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 341 days.

(21) Appl. No.: 15/926,068

(22) Filed: Mar. 20, 2018

(65) Prior Publication Data

US 2019/0297748 A1 Sep. 26, 2019

(51) Int. Cl.
*H05K 7/20* (2006.01)
*G06F 1/20* (2006.01)

(52) U.S. Cl.
CPC .......... *H05K 7/20809* (2013.01); *G06F 1/20* (2013.01); *H05K 7/20727* (2013.01);
(Continued)

(58) Field of Classification Search
CPC ............... G06F 1/181–182; G06F 1/20; G06F 2200/201; H05K 7/20218–20381;
(Continued)

(56) References Cited

U.S. PATENT DOCUMENTS 6,359,781 B1 * 3/2002 Hoss .................. G06F 1/20
165/104.33
7,775,262 B2 8/2010 Liu et al.
(Continued)

FOREIGN PATENT DOCUMENTS

CN 101566748 A 10/2009
JP H01183888 A 7/1989
(Continued)

OTHER PUBLICATIONS

TW Office Action for Application No. 107124547, dated Nov. 13, 2018, w/ First Office Action Summary.
(Continued)

*Primary Examiner* — Mukundbhai G Patel
(74) *Attorney, Agent, or Firm* — Nixon Peabody LLP

(57) ABSTRACT

A method and structure for improving efficiency of cooling and temperature uniformity among a plurality of heat generating electronic devices arranged in rows within a housing, such as a GPU server, utilizing a single source of cooling air. The electronic devices are arranged in a plurality of rows, but the heat sinks for the last row are elevated above the heat sinks of the first row so as to occupy different positions within the cooling air stream. In some embodiments the heat sinks of the electronic devices are extended forward so as to reside near the heat sinks of the electronic devices in the first row, but in a different flow path of cooling air. In other embodiments, a thermo siphon refrigeration system is provided for the electronic devices in the last row, and may be provided for the electronic devices in the first row as well.

16 Claims, 5 Drawing Sheets

(52) U.S. Cl.
CPC .... *G06F 2200/201* (2013.01); *H05K 7/20172* (2013.01); *H05K 7/20327* (2013.01); *H05K 7/20436* (2013.01)

(58) Field of Classification Search
CPC .. H05K 7/20409–20418; H05K 7/20009–202; H05K 7/20809; H05K 7/20727; H05K 7/20436; H05K 7/20327; H05K 7/20172; H01L 23/367–3677; H01L 23/473; H01L 23/46–467
See application file for complete search history.

(56) References Cited

U.S. PATENT DOCUMENTS

| | | | | |
|---|---|---|---|---|
| 2008/0084664 | A1* | 4/2008 | Campbell | H05K 7/20772 361/699 |
| 2013/0155616 | A1* | 6/2013 | Tong | H05K 7/20909 361/696 |
| 2014/0020861 | A1* | 1/2014 | Hyde | F28D 15/02 165/45 |
| 2014/0090814 | A1 | 4/2014 | Kondou et al. | |
| 2015/0043167 | A1 | 2/2015 | Guenin et al. | |
| 2015/0216079 | A1* | 7/2015 | Kondou | H01L 23/3677 165/104.21 |
| 2016/0085277 | A1* | 3/2016 | Samadiani | H05K 7/20809 361/679.53 |
| 2016/0165757 | A1 | 6/2016 | Norton | |
| 2018/0128552 | A1 | 5/2018 | Ito et al. | |

FOREIGN PATENT DOCUMENTS

| | | |
|---|---|---|
| JP | H0383993 U | 8/1991 |
| JP | H07283569 A | 10/1995 |
| JP | 2001267773 A | 9/2001 |
| TW | I262285 B | 9/2006 |
| TW | 200911099 A | 3/2009 |
| TW | 201506596 A | 2/2015 |
| TW | 201706553 A | 2/2017 |
| TW | 201739342 A | 11/2017 |
| WO | 2013-140761 A1 | 9/2013 |
| WO | 2015-128951 A1 | 9/2015 |
| WO | 2017208461 A1 | 12/2017 |

OTHER PUBLICATIONS

TW Search Report for Application No. 107124547, dated Nov. 13, 2018, w/ First Office Action.
TW Office Action for Application No. 107124547, dated Jul. 24, 2019, w/ Second Office Action Summary.
TW Search Report for Application No. 107124547, dated Jul. 24, 2019, w/ Second Office Action.
Extended European Search Report for EP Application No. 18189434.6, received Feb. 4, 2019.
JP Office Action for Application No. 2018-163904, dated Oct. 29, 2019, w/ First Office Action Summary.
JP Office Action for Application No. 2018-163904, dated Jul. 28, 2020, w/ Third Office Action Summary.

* cited by examiner

EXTENDED HEAT SINK DESIGN IN SERVER

TECHNICAL FIELD

In server design, heat build-up is of concern—especially in components downstream of the initial airflow provided by a cooling fan, wherein incoming cooling air is pre-heated before reaching downstream components. Recent developments related to the heat output of graphics processing units (GPUs) and central processing units (CPUs) is becoming critical due to the increasingly higher power required for these units. The present disclosure is directed to reducing the temperature disparity between upstream and downstream components without increasing the power load on the cooling fan. The use of an extended heat sink design reduces the temperature disparity of components.

BACKGROUND

In server design, increasingly higher power of GPUs is being applied. Currently, the highest power of GPUs is up to 300 W, but will soon increase to 400 W. Current heat sink design by air cooling alone is too limited to solve temperature disparity among GPUs to bring the temperature of the units into specification.

As an example of the state of the art in the case of an eight piece GPU modules placed in a server as shown in the schematic layout of FIG. 1A (Prior Art). A perspective view of FIG. 1A is shown in FIG. 1B (Prior Art). There is a 2 U to 3 U height space for GPU heat sink. The placement in of 4 GPUs in the front and 4 GPUs in the rear is as shown in FIGS. 1A and 1B. As can be seen from the placement of fan 12 in FIG. 1A, the initial cooling air in the direction of arrow 9 will pass over the first row of 4 GPUs and cool them to specification. However, the heat picked up by the cooling air results in less cooling in the second row of 4 GPUs. As shown in FIG. 2 (Prior Art), there will be a temperature disparity between the first and second rows of GPUs. The front row of GPUs temperature will be on the order of 6-11° C. lower than the temperature of the GPUs in the rear, second row due to this pre-heating of the cooling air. Hence, in this design, there exists these issues:

(a) Poor temperature distribution causes the GPUs located in the worst location to operate at 71.8° C.;
(b) Thermal limitation of supporting GPUs; and
(c) Higher fan power consumption in attempting to bring GPUs in the worst locations into temperature specification.

The present disclosure presents a structure and method of reducing the temperature disparity among GPUs without increasing power consumption of the fan.

SUMMARY

In one embodiment of this disclosure, an extended heat sink structure permits more even cooling among the GPUs arranged in an eight piece GPU server.

In another embodiment, there are provided upper and lower heat sinks separated into different air cooling paths to reduce temperature disparity among the GPUs.

In a still further embodiment, a thermo-siphon solution is employed where a refrigerant is filled inside a tube and the tube embedded in the extended heat sink.

The disclosure provides a best thermal design with advantages:

(a) No preheating of the cooling air and uniform temperature distribution, with temperature differential between the front and back rows of GPUs reduced to 3° C.;
(b) Best heat transfer efficiency of heat sink;
(c) Reduce worst case temperature location to 65° C.; and,
(d) Lower fan power consumption.

These and other advantages of the disclosure will be better understood in connection with the detailed description when read in conjunction with the appended drawings.

DETAILED DESCRIPTION

Figure 1A:
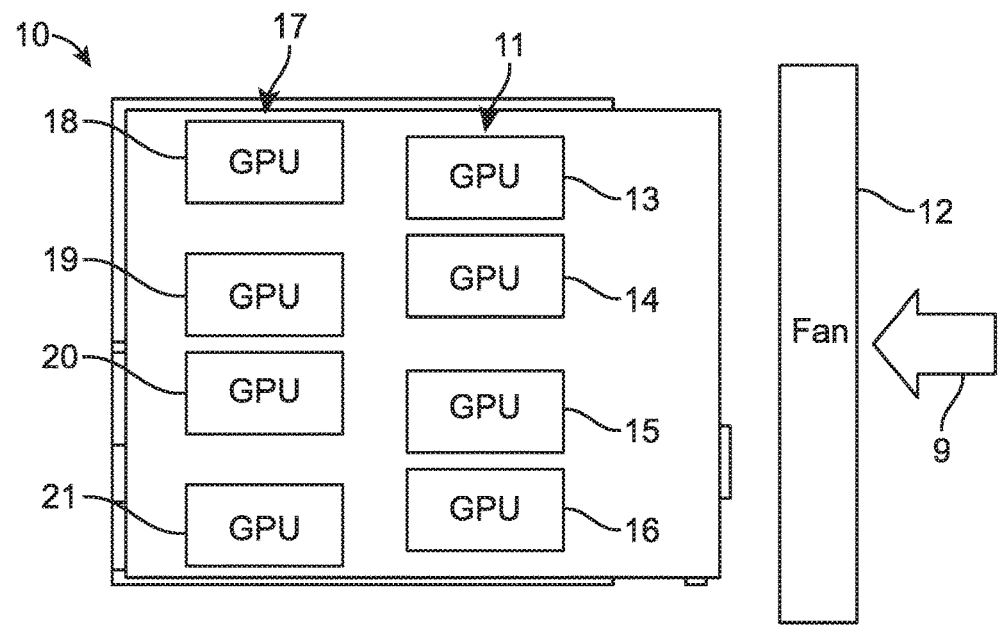
FIG. 1A is a schematic depiction of an eight piece GPU layout in relation to a cooling fan according to the Prior Art.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1B:
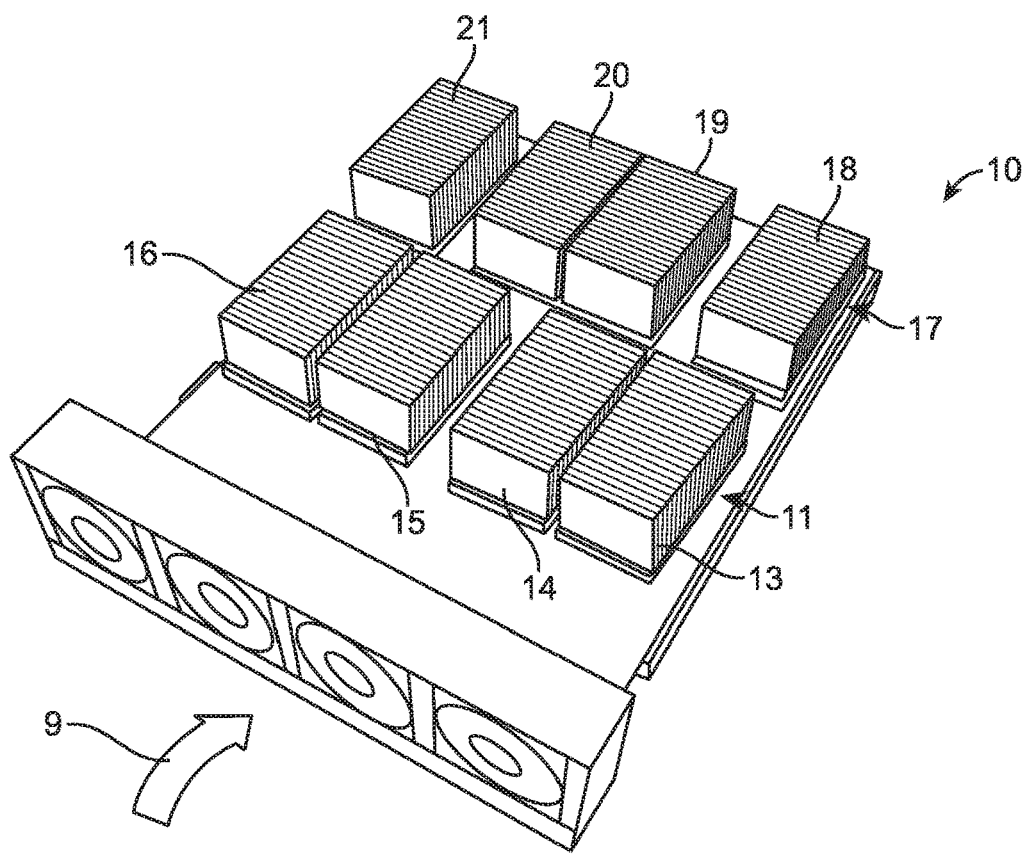
FIG. 1B is a perspective view of the eight piece GPU layout of FIG. 1A according to the Prior Art.

As shown in FIGS. 1A and 1B is an eight piece GPU server 10 according to the Prior Art. In server 10, fan 12 provides a flow of cooling air in the direction of arrow 9, over the heat sinks associated with the individual GPUs contained in server 10. The heat sinks are conventional heat sinks, such as finned heat sinks, and each is associated with its respective GPU. The individual GPUs, each with their individually associated heat sinks, are arranged into two rows, a front row 11, containing GPUs 13, 14, 15 and 16, respectively, and a rear or second row 17, containing GPUs 18, 19, 20 and 21, respectively. Each of the GPUs contains a heat sink at the same height as any other heat sink in the server 10. Accordingly, the heat sinks are all impinged by the same cooling air flow.

The cooling air will impinge upon the first row 11 containing GPUs 13, 14, 15 and 16, and cool these GPUs down to and within the operating temperature specification. However, the cooling air will be pre-heated by the first row 11 of GPUs before the cooling air reaches the second row 17 of GPUs 18, 19, 20 and 21. The additional heat carried by the cooling air passing over the first row 11 will mean that the cooling efficiency will not be at peak or optimum value as it impinges on the second row 17 of GPUs.

Figure 2:
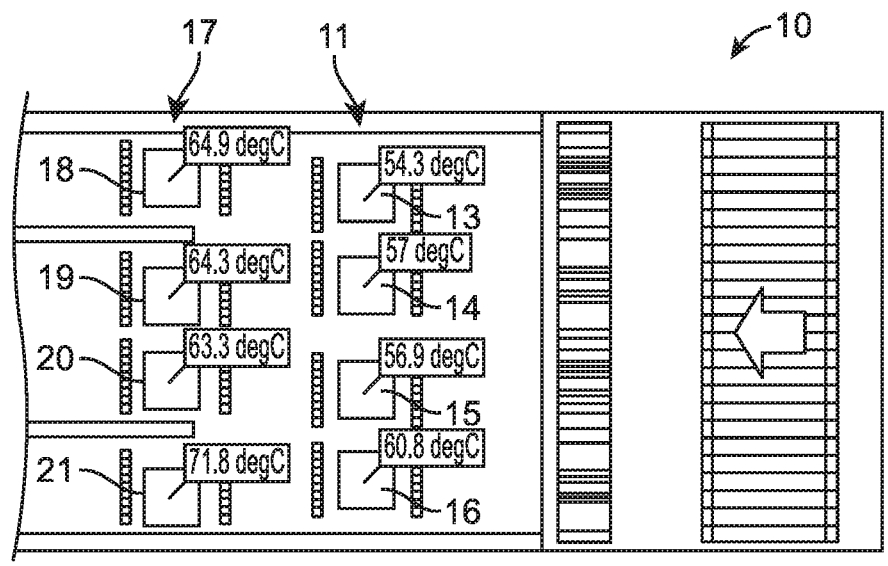
FIG. 2 is a schematic representation of the operating temperatures of the individual GPUs in the eight piece GPU layout of FIGS. 1A and 1B.

As can be seen in FIG. 2, there is a temperature disparity of between 6° C.-11° C. between the first row 11 of GPUs and the second row 17 of GPUs even though both rows are subjected to the same cooling air; and even though all GPUs are operating at the same power levels. The inefficiency of the cooling air is also caused not only by pre-heating of the cooling air as it passes over the first row 11 of GPUs, but also because the pre-heating not only raises the temperature of the cooling air, but also causes eddies in the flow of cooling air which further causes inefficiency of the cooling air impinging upon second row 17 of GPUs. The temperature of the GPUs in the second row causes individual GPUs to operate out of the temperature specifications and further degrades the output of the GPU server 10.

Figure 3:
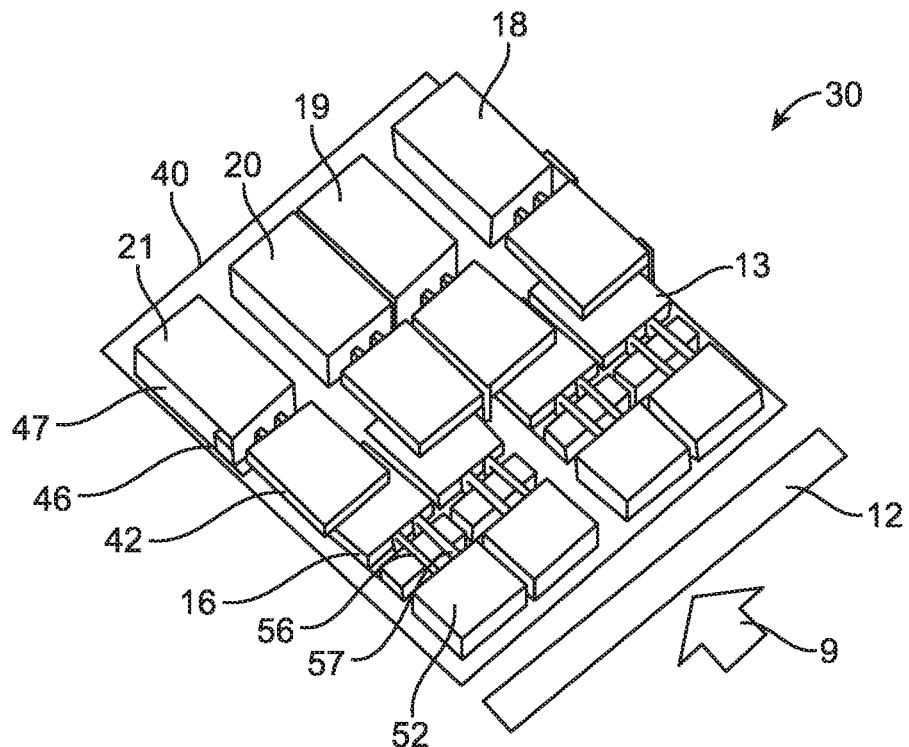
FIG. 3 is a perspective view of the heat sink structure of an eight piece GPU structure according to a first embodiment.

In order to overcome the temperature disparity in an eight piece GPU server of the prior art, applicant has created the structure of an eight piece GPU server 30, as seen in FIG. 3. The flow of cooling air created by fan 12 in the direction of arrow 9 is still passed over the individual GPUs in the server 30. However, applicant has separated the front row of heat sinks and the rear row of heat sinks into different air cooling paths.

Figure 4:
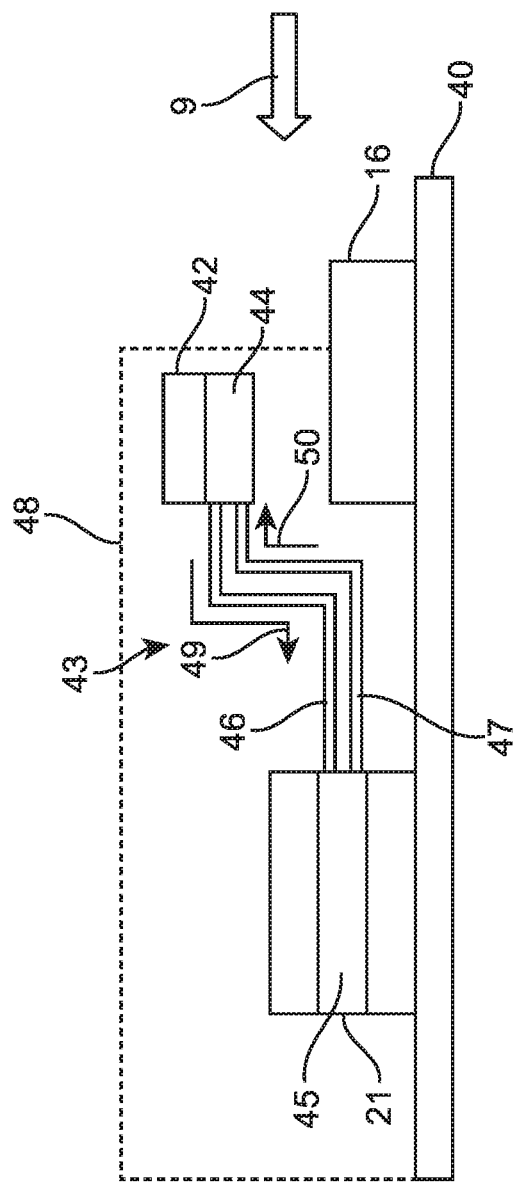
FIG. 4 is a schematic side view of the eight piece GPU structure of FIG. 3.

One embodiment of different cooling paths is shown in the schematic, side view of FIG. 4, the front row 11 in (FIG. 2) of GPU heat sinks are designed at a 1 U to 1.5 U height, but at a lower position than the extended rear GPU heat sink. The rear GPU heat sink is designed at a 1.5 U to 2.0 U upper position, thereby positioning the upper and lower heat sinks in different cooling air paths within housing 48. Another embodiment would be to place the heat sinks of the first row and the heat sinks of the second, or last, row in different flow paths by placing the heat sink for the last row in proximity to, or near, the heat sinks for the first row, but in different cooling air flow paths.

Furthermore, to further improve the efficiency of the cooling, air flow is increased by the provision of a thermo siphon refrigeration system connected between the extended heat sink and the GPUs of the second row.

Turning specifically to FIG. 4, where an arrangement of GPUs is carried on motherboard 40, an extended heat sink 42 for GPU 21 is placed in the flow path 9 of cooling air at a height above the flow path of cooling air over the lower placed heat sink for GPU 16. In addition, a refrigeration system, in the form of a thermo siphon system, is shown generally at 43 and comprises a chamber or reservoir 44 in combination with extended heat sink 42. GPU 21 also contains a chamber or reservoir 45, which is operatively connected to reservoir 44 by a pair of conduits 46, 47. The refrigerant in refrigerant system 43 can be any known coolant, such as water or other liquid which boils at a temperature below the boiling point of water, such as a refrigerant discussed in detail below. Vapor created by the heating of GPU 21 flows through conduit 47 in direction of the arrow until it reaches reservoir 44, where it condenses. The condensed coolant in reservoir 44 flows by gravity in direction of arrow 49 through conduit 46 into reservoir 45, where it is again heated and vaporized. It should be understood that a similar arrangement of extended heat sinks exists for each of the rear row GPUs 20, 19 and 18 in the same manner as shown for GPU 21.

Figure 5:
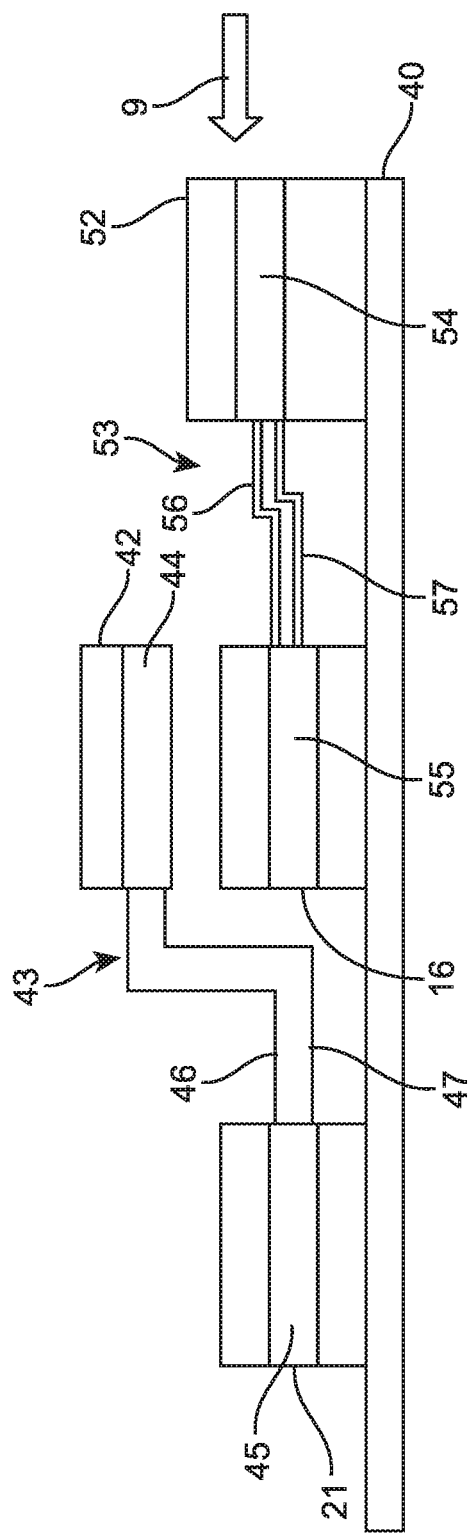
FIG. 5 is a schematic side view of a second embodiment of refrigeration system for the first row 11 of GPUs.

In a still further refinement of the improved cooling structure according to the present embodiments, the front row of 11 of GPUs (in FIG. 2) could also be provided with a refrigerant system, in the form of a thermo siphon system similar in structure and function to that discussed in connection with FIG. 4, as shown in FIG. 5. As shown in FIG. 5, the same arrangement of extended heat sink 42 and refrigeration system 43 is provided, as described in connection with FIG. 4. However, an additional refrigeration system 53, also in the form of a thermo siphon system is provided for the front row of GPUs, as exemplified by GPU 16. Similar to the function of the refrigeration system 43 for the second row of GPUs exemplified by GPU 21, refrigeration system 53 is provided for the first row of GPUs. A reservoir 54 in extended heat sink 52 contains a coolant, such as water, or any liquid that boils at a temperature lower than water, such as a refrigerant. Refrigerants such as R134a, R22, R12, R407c, R410a, etc., and combinations thereof, can be utilized, with R134a being preferred. Reservoir 54 is connected to reservoir 55 associated with GPU 16. Reservoirs 54 and 55 are operatively connected by conduits 56 and 57 respectively, in which a vapor exits reservoir 55 due to heating by GPU 16, and travels via conduit 57 until it condenses in reservoir 54. Condensed liquid refrigerant then flows by gravity through conduit 56 until it reaches reservoir 55, and the cycle begins again. Although illustrations are provided for conduits 46, 47, 56 and 57, in practice, the heat sinks may be surrounded by fins to improve their cooling efficiency such that the conduits are not visible, and the heat sinks may appear as a whole body.

Figure 6:
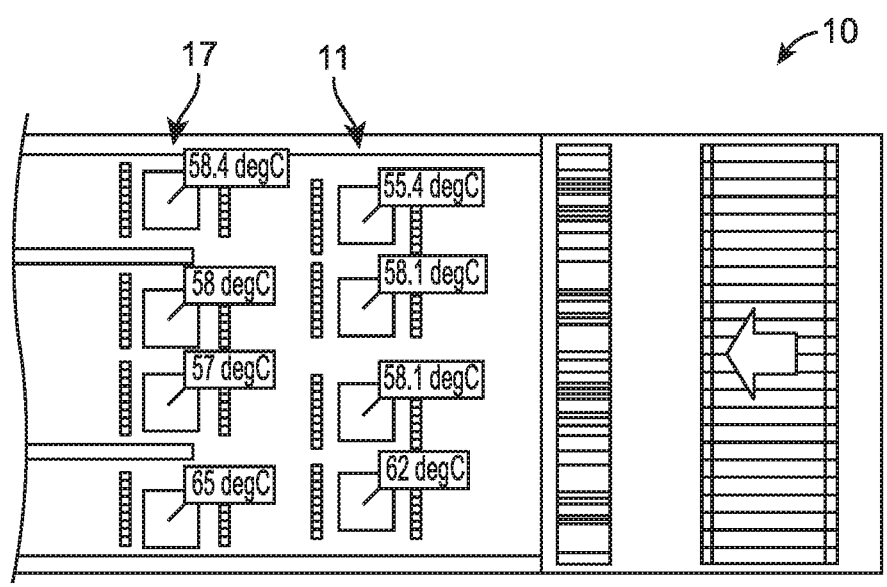
FIG. 6 is a schematic representation of the operating temperatures of the individual GPUs in the eight piece GPU layout of FIG. 3 according to an embodiment of the disclosure.

As shown in the schematic temperature distribution of FIG. 6 for the individual GPUs shown in FIG. 3, the use of the extended heat sinks according to the present embodiment, lowers the temperature differential between the first row 11 and the second row 17 of GPUs to about 3° C. or less. Thus, without increasing the power consumption of the cooling fan, the operating temperatures of the individual GPUs can be reduced and maintained within their operating specification.

While we have exemplified heat generating GPUs in an array of eight units in two rows, the principles disclosed herein are applicable to any device having heat generating electronic devices comprising eight or more units arranged in two or more rows, as being the sources of heat in a server. As such, it should be regarded by those skilled in the art that the teaching of the instant disclosure can be applied to the cooling of other heat generating electronic devices, such as the cooling of CPUs.

The terminology used herein is for the purpose of describing particular embodiments only and is not intended to be limiting of the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A first extended heat sink in a system having a plurality of heat generating processing units, the plurality of processing units is arranged in a first row and a second row, the system further comprising a source of cooling air causing a flow of cooling air in a direction from the first row toward the second row, the first extended heat sink extending from a first processing unit in the second row and overhanging a second processing unit in the first row, the first extended heat sink being elevated from the first processing unit in the second row, the first extended heat sink further including a refrigeration circuit, wherein the refrigeration circuit includes:
 a first reservoir for refrigerant in the first extended heat sink; and
 a second reservoir for refrigerant in contact with (i) at least one GPU in the second row, (ii) a first conduit for conveying vapor refrigerant from the second reservoir to the first reservoir, and (iii) a second conduit for conveying liquid refrigerant in the first reservoir to the second reservoir.

2. The first extended heat sink of claim 1, wherein the first row and the second row are contained in a housing of a server.

3. The first extended heat sink of claim 1, wherein the conveying of the liquid refrigerant in the second conduit is effected by gravity.

4. The first extended heat sink of claim 1, wherein the plurality of processing units includes eight processing units in total, the eight processing units being arranged such that there are four processing units in the first row and four processing units in the second row, and wherein each processing unit in the second row is associated with its own extended heat sink.

5. The first extended heat sink of claim 4, wherein a temperature difference between a processing unit in the first row and a processing unit in the second row is 3° C. or less.

6. The first extended heat sink of claim 1, wherein the refrigerant is at least one selected from the group consisting of R134a, R22, R12, R407c, and R410a.

7. The first extended heat sink of claim 1, wherein the source of cooling air comprises at least one fan.

8. The first extended heat sink of claim 1, wherein the plurality of processing units is contained within a housing.

9. A server comprising an array of heat generating processing units arranged in a first row and a second row within a housing, each of the processing units in the array comprising (i) a heat sink and (ii) a thermo siphon refrigeration circuit,
 the refrigeration circuit for each of the processing units in the second row comprising:
  a first reservoir for refrigerant in an extended heat sink; and
  a second reservoir for refrigerant in contact with (i) the each of the processing units in the second row; (ii) a first conduit for conveying vapor refrigerant from the second reservoir to the first reservoir, and (iii) a second conduit for conveying liquid refrigerant in the first reservoir to the second reservoir,
 the refrigeration circuit for each of the processing units in the first row comprising:
  a third reservoir for refrigerant in the heat sink; and
  a fourth reservoir for refrigerant in contact with (i) the each of the processing units in the first row, (ii) a third conduit for conveying vapor refrigerant from the fourth reservoir to the third reservoir, and (iii) a fourth conduit for conveying liquid refrigerant in the third reservoir to the fourth reservoir,
 wherein the heat generating processing units in the second row have their heat sinks extended within the housing so as to be positioned near the heat sinks of the processing units of the first row.

10. The server of claim 9, wherein there are eight processing units arranged into two rows with four processing units in the first row and four processing units in the second row, each of the processing units in the second row comprising an extended heat sink positioned within the housing such that the extended heat sink is in a position higher than the heat sink of any processing units in the first row.

11. The server of claim 9, wherein the refrigerant is at least one refrigerant selected from the group consisting of R134a, R22, R12, R407c and R410a.

12. A method of improving heat transfer efficiency of a heat sink associated with heat generating electronic devices cooled by a single flow of cooling air, the heat generating electronic devices being arranged in rows within a housing, each electronic device having its own heat sink, the method comprising:
 elevating the heat sinks of a second row of electronic devices above a height of the heat sinks of the electronic devices in a first row, such that the heat sinks of the second row of electronic devices overhang the electronic devices in the first row;
 extending positions of the heat sinks of the electronic devices in the second row so as to be positioned near the heat sinks of the electronic devices of the first row; and
 cooling the heat sinks of the electronic devices in the second row with a thermo siphon utilizing a confined refrigerant which is vaporized by the heat generated by the electronic devices in the second row.

13. The method of claim 12, wherein the heat generating electronic devices are at least one selected from the group consisting of GPUs and CPUs.

14. The method of claim 12, wherein the vaporized refrigerant is condensed into a liquid by removal of heat in the heat sinks positioned above the electronic devices of the first row.

15. The method of claim 14, further comprising:
 flowing the condensed liquid by the influence of gravity back towards the heat generating electronic devices in the second last row; and
 repeating the vaporization of refrigerant step.

16. The method of claim 15, wherein the refrigerant is at least one refrigerant selected from the group consisting of R134a, R22, R12, R407c and R410a.

* * * * *